US010924076B2

(12) United States Patent
Landick et al.

(10) Patent No.: US 10,924,076 B2
(45) Date of Patent: *Feb. 16, 2021

(54) ACTIVE DISTRIBUTED MODE ACTUATOR

(71) Applicant: Google LLC, Mountain View, CA (US)

(72) Inventors: Graham Landick, Ely (GB); Neil John Harris, Los Altos, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/833,986

(22) Filed: Mar. 30, 2020

(65) Prior Publication Data
US 2020/0336123 A1 Oct. 22, 2020

Related U.S. Application Data

(63) Continuation of application No. 16/658,924, filed on Oct. 21, 2019, now Pat. No. 10,630,253, which is a
(Continued)

(51) Int. Cl.
*H03G 5/16* (2006.01)
*H04R 3/04* (2006.01)
(Continued)

(52) U.S. Cl.
CPC ............ *H03G 5/16* (2013.01); *H04R 3/04* (2013.01); *H04R 17/00* (2013.01); *H04R 17/10* (2013.01);
(Continued)

(58) Field of Classification Search
CPC . H03G 5/16; H04R 3/04; H04R 17/00; H04R 17/10; H04R 7/045; H04R 2440/05; H04R 2499/11
See application file for complete search history.

(56) References Cited

U.S. PATENT DOCUMENTS

| 4,400,642 A | 8/1983 | Kiraly |
| 6,584,206 B2 | 6/2003 | Ohashi |

(Continued)

FOREIGN PATENT DOCUMENTS

| CN | 104919816 | 1/2006 |
| CN | 107484092 | 9/2015 |

(Continued)

OTHER PUBLICATIONS

PCT International Preliminary Report on Patentability in International Appln. No. PCT/GB2018/053704, dated Nov. 4, 2019, 7 pages.

(Continued)

*Primary Examiner* — David L Ton
(74) *Attorney, Agent, or Firm* — Fish & Richardson P.C.

(57) ABSTRACT

Methods, systems, and apparatus, including computer programs encoded on computer storage media, for changing a distributed mode loudspeaker's fundamental frequency. One of the systems includes a distributed mode loudspeaker comprising an actuator that includes: a supported portion, and a cantilevered portion having a length, a first fundamental frequency, and adapted to create a force to cause vibration of a load to generate sound waves using the first fundamental frequency; a support element connected to the supported portion of the actuator and adapted to adjust, based on a change to a shape of the support element, a size of the length of the cantilevered portion to change the first fundamental frequency to a second fundamental frequency with which the load will generate sound waves; and a frequency selection module that provides a signal to the support element to cause the support element to change shape.

18 Claims, 4 Drawing Sheets

Device Perspective View

Device Side View at $T_0$

Related U.S. Application Data continuation of application No. 15/848,292, filed on Dec. 20, 2017, now Pat. No. 10,476,461.

(51) Int. Cl.
*H04R 17/00* (2006.01)
*H04R 17/10* (2006.01)
*H04R 7/04* (2006.01)

(52) U.S. Cl.
CPC .......... *H04R 7/045* (2013.01); *H04R 2440/05* (2013.01); *H04R 2499/11* (2013.01)

(56) References Cited

U.S. PATENT DOCUMENTS

| | | |
|---|---|---|
| 6,795,561 B1 | 9/2004 | Bank |
| 7,475,598 B2 | 1/2009 | Starnes et al. |
| 7,916,880 B2 | 3/2011 | Starnes |
| 8,854,923 B1 | 10/2014 | Eyster |
| 10,264,348 B1 | 4/2019 | Harris |
| 10,381,996 B2 | 8/2019 | Landick |
| 2001/0017927 A1 | 8/2001 | Bachmann |
| 2002/0015507 A1 | 2/2002 | Harris et al. |
| 2006/0207340 A1 | 9/2006 | Starnes et al. |
| 2010/0086151 A1 | 4/2010 | Ruiter |
| 2011/0176695 A1 | 7/2011 | Bai |
| 2012/0119617 A1 | 5/2012 | Takahashi et al. |
| 2012/0149437 A1 | 6/2012 | Zurek |
| 2014/0355777 A1 | 12/2014 | Nabata |
| 2015/0018046 A1 | 1/2015 | Nabata |
| 2015/0243874 A1 | 8/2015 | East et al. |
| 2016/0050498 A1 | 2/2016 | Ogata |
| 2018/0249248 A1 | 8/2018 | Harris |
| 2019/0190478 A1 | 6/2019 | Landick |
| 2019/0222187 A1 | 7/2019 | Landick |

FOREIGN PATENT DOCUMENTS

| | | |
|---|---|---|
| WO | WO2006003367 | 1/2006 |
| WO | WO 2016/202790 | 12/2016 |

OTHER PUBLICATIONS

PCT International Search Report and Written Opinion in International Appln. No. PCT/GB2018/053704, dated Mar. 29, 2019, 14 pages.
TW Office Action in Taiwan Appln. No. 107144953, dated Dec. 10, 2019, 8 pages (with machine translation).
CN Office Action in Chinese Appln. No. 201880031435.9, dated Aug. 25, 2020, 11 pages (with English translation).
KR Office Action in Korean Appln. No. 10-2019-7033573, dated Jul. 24, 2020, 13 pages (with English translation).

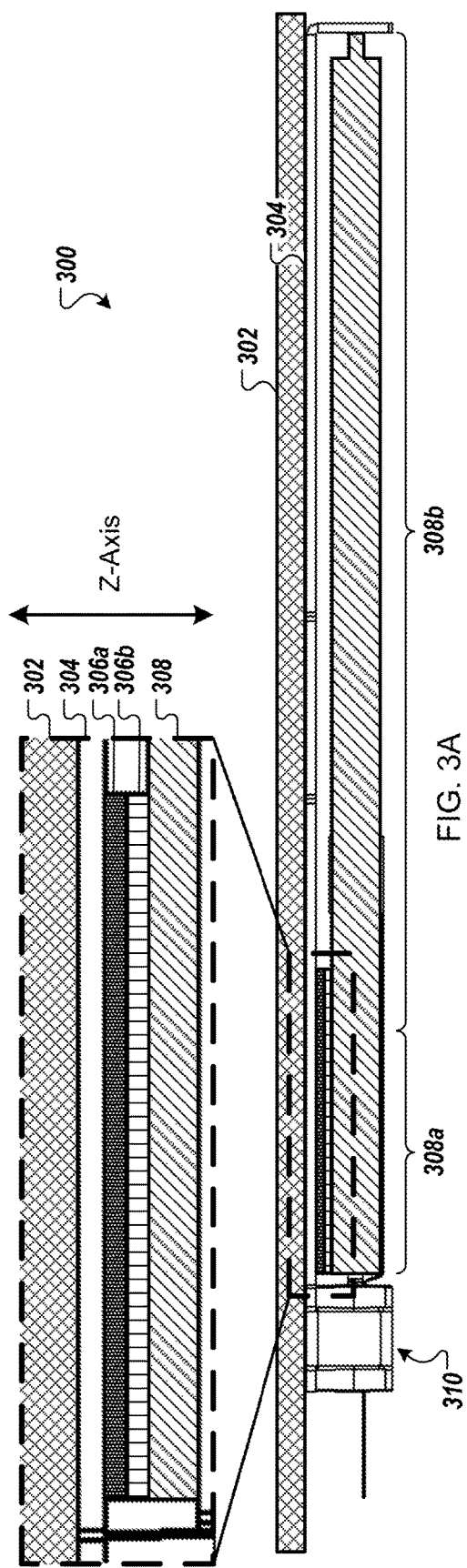
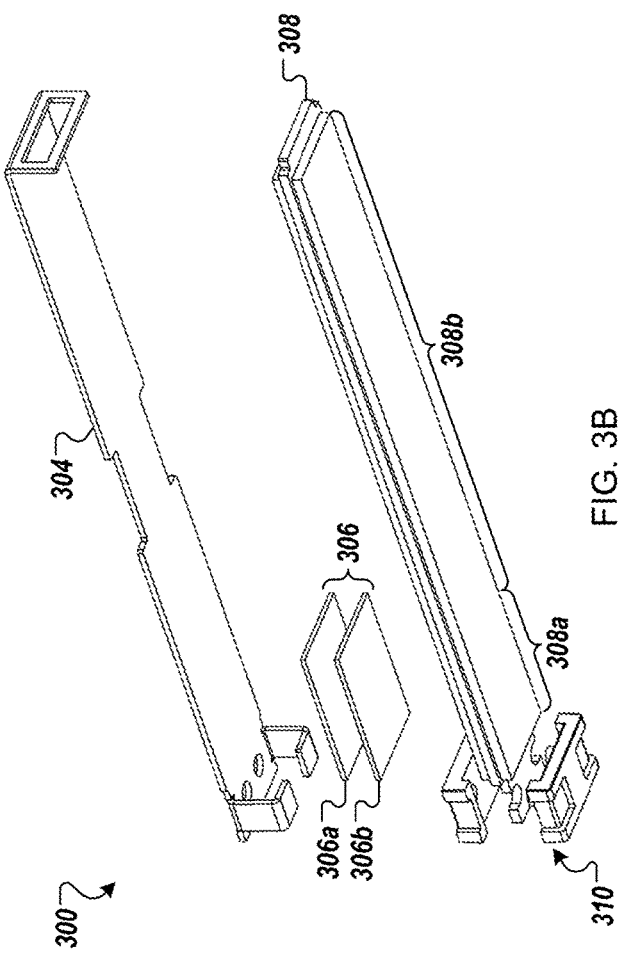
FIG. 3A
FIG. 3B

ACTIVE DISTRIBUTED MODE ACTUATOR

CROSS-REFERENCE TO RELATED APPLICATION

This application is a continuation of U.S. application Ser. No. 16/658,924, filed Oct. 21, 2019, which is a continuation of Ser. No. 15/848,292, filed Dec. 20, 2017, the contents of which are incorporated by reference herein.

BACKGROUND

Some devices use a distributed mode loudspeaker ("DML") to generate sound. A DML is a speaker that creates sound by causing a panel to vibrate. A DML may use a distributed mode actuator ("DMA"), e.g., a piezoelectric transducer, to cause the panel to vibrate and generate sound instead of a voice coil actuator. For instance, a smartphone may include a DMA that applies force to a display panel (e.g., a LCD or an OLED panel) in the smartphone. The force creates vibrations of the display panel that couple to surrounding air to generate sound waves, e.g., in the range of 20 Hz to 20 kHz which may be audible to a human ear.

SUMMARY

To allow a distributed mode loudspeaker ("DML") to adjust a fundamental frequency with which the DML generates sound waves, the DML adjusts a length of a cantilevered portion of a distributed mode actuator ("DMA") included in the DML. This allows the DML to generate a wider range of frequencies based on an output mode, a volume of the output sound, content included in an output sound, or a combination of two or more of these. Generation of a wider range of frequencies may allow a DML to more accurately reproduce sounds.

For instance, a DML may include a DMA with a supported portion and a cantilevered portion. The DMA has a first fundamental frequency based on a first length of the cantilevered portion. The DML generates sounds within a first frequency range defined by the first fundamental frequency, e.g., a low frequency range.

To enable the DML to dynamically generate sounds within a second frequency range different from the first frequency range, e.g., a higher frequency range, the DML changes a length of the supported portion of the DMA which causes the first length of the cantilevered portion to change, i.e., because the total length of the DMA remains substantially constant. For example, the DML may increase the length of the supported portion which causes a decrease in the first length of the cantilevered portion and an increase in the fundamental frequency of the DMA. Alternatively, when the DML decreases the length of the supported portion, the first length increases and the fundamental frequency of the DMA decreases.

The DML may include a frequency selection module, e.g., a digital signal processor ("DSP"), that provides a signal to a support. When the support receives the signal, a length of the support changes, causing a change in the length of the supported portion of the DMA and the first length of the cantilevered portion and causing a change in the fundamental frequency of the DML.

The frequency selection module may determine a change to the fundamental frequency using an output mode of the DML, a content type for a sound that the DML will generate, a volume for a sound that the DML will generate, or a combination of two or more of these. For instance, the frequency selection module may determine whether a device that includes the DML, such as a smartphone, will output sound in a "hands free" mode, e.g., using a speakerphone, or a handheld mode as the output mode. The frequency selection module may select a lower fundamental frequency for a handheld mode and a higher fundamental frequency for a hands free mode. In some examples, the frequency selection module may select a lower fundamental frequency for generation of lower volume sounds or a higher fundamental frequency for generation of higher volume sounds.

In general, one innovative aspect of the subject matter described in this specification can be embodied in methods that include the actions of receiving, by a distributed mode loudspeaker, a signal representing a sound to generate; determining, by a frequency selection module in the distributed mode loudspeaker, whether to change a current fundamental frequency of an actuator included in the distributed mode loudspeaker; sending, by the frequency selection module, a signal to a support element based on the determination whether to change the current fundamental frequency of the actuator; and after sending the signal to the support element, providing, by the distributed mode loudspeaker, an activation signal to the actuator to cause the actuator to generate a force that vibrates a load which generates the sound. Other embodiments of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In general, one innovative aspect of the subject matter described in this specification can be embodied in a system that includes a distributed mode loudspeaker comprising an actuator that includes: a supported portion, and a cantilevered portion having a length, a first fundamental frequency, and adapted to create a force to cause vibration of a load to generate sound waves using the first fundamental frequency; a support element connected to the supported portion of the actuator and adapted to adjust, based on a change to a shape of the support element, a size of the length of the cantilevered portion to change the first fundamental frequency to a second fundamental frequency with which the load will generate sound waves; and a frequency selection module that provides a signal to the support element to cause the support element to change shape. Other embodiments of this aspect include corresponding computer systems, methods, and computer programs recorded on one or more computer storage devices, each configured to perform the actions of the operations. The computer system may include one or more computers and can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In general, one innovative aspect of the subject matter described in this specification can be embodied in a system or apparatus that includes a smartphone comprising: a display configured to present content; and a distributed mode loudspeaker comprising: an actuator that includes: a supported portion, and a cantilevered portion having a length, a first fundamental frequency, and adapted to create a force to cause vibration of a load to generate sound waves using the first fundamental frequency; a support element connected to the supported portion of the actuator and adapted to adjust, based on a change to a shape of the support element, a size of the length of the cantilevered portion to change the first fundamental frequency to a second fundamental frequency with which the load will generate sound waves; and a frequency selection module that provides a signal to the support element to cause the support element to change shape. Other embodiments of this aspect include corresponding computer systems, methods, and computer programs recorded on one or more computer storage devices, each configured to perform the actions of the operations. The computer system may include one or more computers and can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The foregoing and other embodiments can each optionally include one or more of the following features, alone or in combination. The frequency selection module may select an amount of current as the signal to provide to the support element. The frequency selection module may determine an output mode for the distributed mode loudspeaker; and may select the signal to provide to the support element using the determined output mode. The output mode may be one of a receiver mode or a hands-free mode. The frequency selection module may select the signal that will cause an increase in the length and the second fundamental frequency to be lower than the first fundamental frequency based on the frequency selection module determining that the output mode is the receiver mode. The frequency selection module may select the signal that will cause a decrease in the length and the second fundamental frequency to be higher than the first fundamental frequency based on the frequency selection module determining that the output mode is the hands-free mode.

In some implementations, the frequency selection module may determine a type of audio content to generate; and may select the signal to provide to the support element using the type of content to generate. The type of audio content to generate may be one of music, a telephone conversation, video playback, audio for a game, or a device feedback sound. The frequency selection module may determine whether an output volume for a sound the load will generate satisfies a threshold volume; and may select the signal to provide to the support element based on the determination whether the output volume for the sound the load will generate satisfies the threshold volume. The frequency selection module may select the signal that will cause an increase in the length and the second fundamental frequency to be lower than the first fundamental frequency based on the output volume does not satisfy the threshold volume. The frequency selection module may select the signal that will cause a decrease in the length, and the second fundamental frequency to be higher than the first fundamental frequency based on the output volume satisfying a threshold volume.

In some implementations, the distributed mode loudspeaker may include a base adjacent to a first surface of the support element opposite a second surface of the support element that is adjacent to the supported portion of the actuator. The support element may include an electroactive element that includes the first surface and an adjustment support that includes the second surface, a third surface of the electroactive element that is opposite the first surface connecting to a fourth surface of the adjustment support that opposite that the second surface. The frequency selection module may provide the signal to the electroactive element to cause the electroactive element to apply a force onto the adjustment support, changing the shape of the adjustment support, adjusting the size of the length and changing the first fundamental frequency to the second fundamental frequency with which the load will generate sound waves. The electroactive element may be a piezoelectric material. The electroactive element may be a material with a low latency reaction. The adjustment support may be an elastomer. The elastomer may be one of neoprene or a silicon compound. The actuator may be piezoelectric material. The length of the cantilevered portion and a second length of the supported portion may be along the same axis of the distributed mode loudspeaker. A total length of the actuator may be substantially fixed. The total length may be a sum of the first length and the second length. The frequency selection module may be a digital signal processor. The display may be the load.

Among other advantages, the systems and methods described below may allow a distributed mode loudspeaker to generate sounds in a wider range of frequencies, with a higher volume, or both, compared to other systems. For instance, a distributed mode loudspeaker may dynamically select a fundamental frequency to use when generating a sound based on an output mode, content included in the sound, a volume of the sound, or a combination of two or more of these. Generation of sounds in a wider range of frequencies, dynamic selection of an actuator fundamental frequency, or both, may allow a distributed mode loudspeaker to more accurately reproduce sounds, e.g., closer to an original presentation of the sound, generate higher volume sounds, or both.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 3A-B show an example of a distributed mode loudspeaker with a support element that, upon changing shape, changes a length of a cantilevered portion of an actuator.

Like reference numbers and designations in the various drawings indicate like elements.

DETAILED DESCRIPTION

Figure 1:
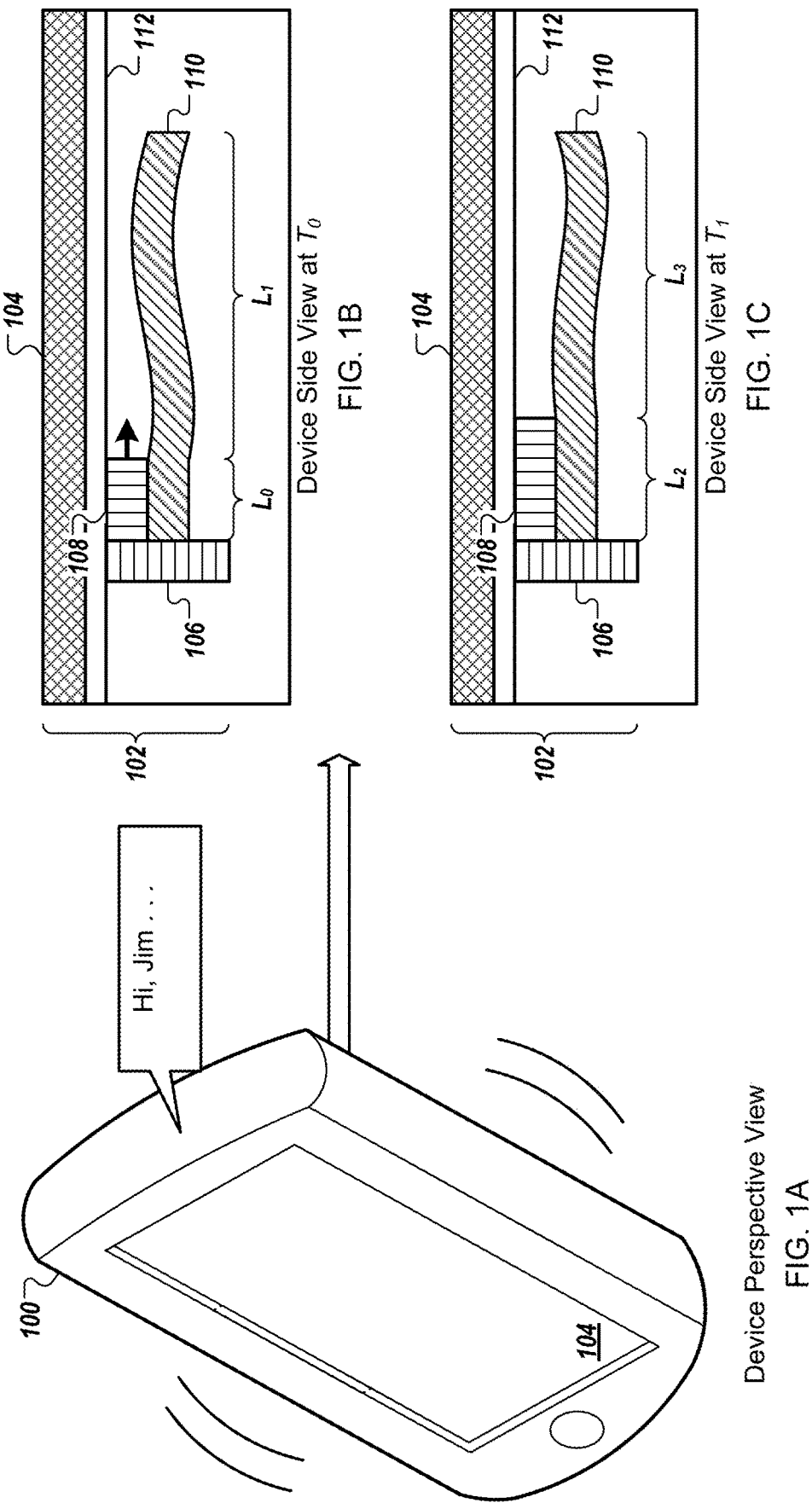
FIGS. 1A-C show an example of a device that includes a distributed mode loudspeaker.

FIGS. 1A-C show an example of a device 100 that includes a distributed mode loudspeaker 102. The device 100, such as a smartphone or another type of computer, uses the distributed mode loudspeaker 102, shown in FIG. 1C, to generate sound. The sound may be any type of sound, such as a phone conversation, music, an audio stream, sound for a video, or sound for a game. The device 100 may be any appropriate type of device that includes a distributed mode loudspeaker 102.

The distributed mode loudspeaker 102 includes a panel 104 that vibrates and generates sound waves. The panel 104 may be any appropriate panel included in the device 100 that can generate sound waves. For instance, the panel 104 may be a display panel included in the device 100. The display panel may include a touch screen or any other appropriate type of display.

The distributed mode loudspeaker 102 includes a support molding 106 that connects the panel 104 to an actuator 110, e.g., a distributed mode actuator. For instance, the support molding 106 is rigidly connected to the panel 104, the actuator 110, or both, to enable the support molding 106 to transfer a force, generated by the actuator 110, to the panel 104 and to cause the panel to generate sound. For the avoidance of doubt, the term "support molding" should not be taken to mean that the support molding must be manufactured, in whole or in part, by a molding process.

In some implementations, one or more other components may be part of the connection between the panel 104 and the support molding 106. For example, the support molding 106 may rigidly connect to a chassis 112 that rigidly connects to the panel 104. In some examples, the chassis 112 is not part of the distributed mode loudspeaker 102. In some examples, the chassis 112 is part of the distributed mode loudspeaker.

The distributed mode loudspeaker 102 can adjust a resonance mode of the actuator 110 using a support element 108. The support element 108 may include one or more layers, as described in more detail with reference to FIGS. 3A-B, that are each parallel to the panel 104. One or more of the layers may have consistent properties, constant properties, or both, throughout the layer. For instance, upon receiving an input signal, a spatial volume of the support element 108, or a layer included in the support element 108, may uniformly change throughout the support element 108. The spatial volume may uniformly increase in response to receipt of the input signal. The spatial volume may uniformly decrease in response to receipt of the input signal.

The distributed mode loudspeaker 102 may adjust the resonance mode of the actuator 110 by changing a length of the support element 108, e.g., by increasing a spatial volume of the support element, which in turn changes a first length $L_0$ of a supported portion of the actuator 110 and a length $L_1$ of a cantilevered portion of the actuator 110. The adjustment of the resonance mode of the actuator 110 may optimize performance of the actuator 110 for generating sounds in various frequency ranges, e.g., may enable the actuator 110 to generate sounds with a greater decibel level for a particular output frequency.

Figure 2:
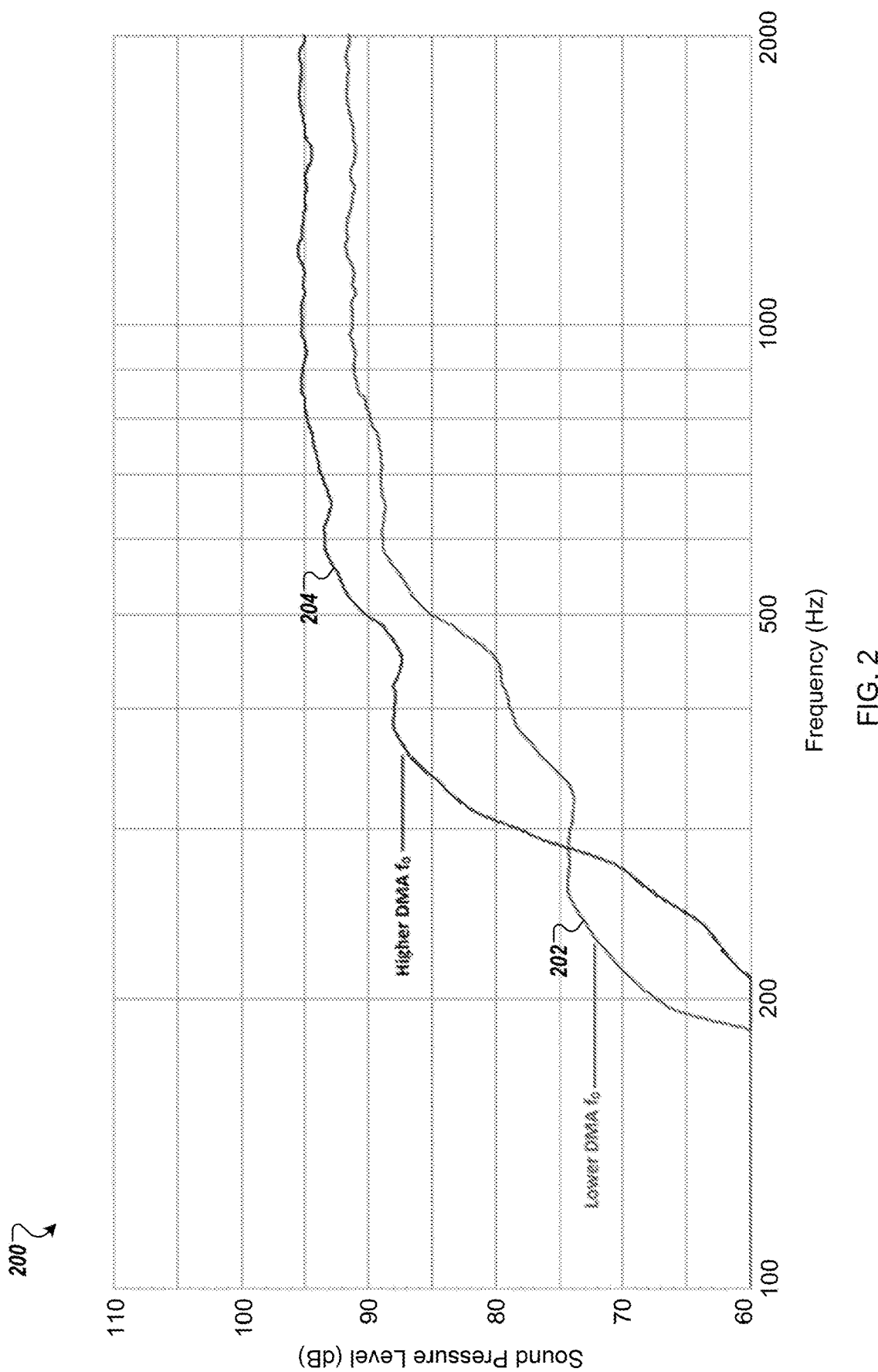
FIG. 2 depicts a graph of frequency versus sound pressure level for two different fundamental frequencies.

For example, when the distributed mode loudspeaker 102 decreases the length of the support element 108 and the length $L_0$ of the supported portion of the actuator 110, the distributed mode loudspeaker 102 reduces the fundamental frequency $F_0$ of the actuator 110 by increasing the length $L_1$ of the cantilevered portion of the actuator 110. This reduction in the fundamental frequency $F_0$ may increase the low bandwidth extension of the distributed mode loudspeaker 102, e.g., enable the distributed mode loudspeaker 102 to generate higher volume, lower frequency sound. An example of the increase in low bandwidth extension is shown by a first line 202 in a graph 200 shown in FIG. 2, compared to the second line 204 with a decreased low bandwidth extension. The distributed mode loudspeaker 102 may use a longer length $L_1$ cantilevered portion of the actuator 110 in a receiver mode, e.g., when generating sounds around 300 Hz, when the panel 104 is near a user's ear (e.g. in contact with the user's ear), or both. In some examples, the distributed mode loudspeaker 102 may use the longer length $L_1$ cantilevered portion when generating sounds between 200 and 300 Hz.

FIG. 2 depicts a graph 200 of frequency versus sound pressure level for two different fundamental frequencies. For example, an actuator with a lower fundamental frequency $F_0$ and a longer length $L_1$ cantilevered portion may have frequency represented by the first line 202. An actuator with a higher fundamental frequency $F_0$ and a shorter length $L_3$ cantilevered portion may have frequency represented by the second line 204.

Returning to FIGS. 1A-C, when the distributed mode loudspeaker 102 increases the length of the support element 108, as shown in the change from time $T_0$ in FIG. 1B to the time $T_1$ FIG. 1C, the length $L_0$ of the supported portion of the actuator 110 increases to $L_2$ and the length $L_1$ of the cantilevered portion of the actuator 110 decreases to $L_3$. This decrease in the length of the cantilevered portion of the actuator to $L_3$ increases the fundamental frequency $F_0$ of the actuator 110 which may increase the high bandwidth extension of the distributed mode loudspeaker 102, e.g., enable the distributed mode loudspeaker 102 to generate higher volume, higher frequency sound. An example of the increase in high bandwidth extension is shown by the second line 204 in the graph 200 shown in FIG. 2, compared to the first line 202 with a decreased high bandwidth extension. The distributed mode loudspeaker 102 may use a shorter length $L_3$ cantilevered portion of the actuator in a hands free mode, e.g., when generating sounds around 450 Hz, when the device is in a "speakerphone" mode, or both. In some examples, the distributed mode loudspeaker 102 may use the shorter length $L_3$ cantilevered portion when generating sounds between 350 and 20 kHz.

The distributed mode loudspeaker 102 includes a frequency selection module that determines a desired fundamental frequency $F_0$ for the actuator 110 when the distributed mode loudspeaker 102 generates a sound. The frequency selection module uses the desired fundamental frequency $F_0$ to determine a length for the cantilevered portion of the actuator 110. The frequency selection module may allow the distributed mode loudspeaker 102 to automatically adjust the length of the cantilevered portion of the actuator 110 depending on the output mode of the distributed mode loudspeaker 102 and a corresponding optimal output frequency range for that output mode.

When the desired length for the cantilevered portion of the actuator 110 is the same as the current length of the cantilevered portion, the frequency selection module may determine not to change the length of the cantilevered portion. For instance, during time period $T_0$ when the cantilevered portion has length $L_1$, the frequency selection module may receive an input signal for the distributed mode loudspeaker 102. The frequency selection module uses the input signal to determine a desired fundamental frequency $F_0$ for the actuator 110 and a length for the cantilevered portion that will cause the actuator 110 to have the desired fundamental frequency $F_0$. When the determined length is the same as the current length $L_1$ of the cantilevered portion of the actuator 110, the frequency selection module determines not to change the length of the cantilevered portion of the actuator 110.

When the determined length of the cantilevered portion of the actuator 110 is different than the current length, the frequency selection module sends a signal to the support element 108 to cause a change in size of the support element to change the length of the cantilevered portion of the actuator 110. For example, the frequency selection module may receive an input signal for the distributed mode loudspeaker 102 during time period $T_0$ when the cantilevered portion has length $L_1$. The frequency selection module uses the input signal to determine that the cantilevered portion should have length $L_3$ for the distributed mode loudspeaker 102 to generate sound based on the input signal. Since the current length $L_1$ is different than the needed length $L_3$, the frequency selection module sends a signal to the support element 108 to cause the support element 108 to change shape and to change the length of the cantilevered portion of the actuator 110 from $L_1$ to $L_3$. When the support element 108 receives the signal during time period $T_1$, the support element 108 changes shape, e.g., becomes longer, which causes the length of the cantilevered portion of the actuator 110 to change. For instance, the length of the cantilevered portion of the actuator 110 may decrease from $L_1$ to $L_3$ as shown in FIGS. 1B-C.

FIGS. 3A-B show an example of a distributed mode loudspeaker 300 with a support element 306 that, upon changing shape, changes a length of a cantilevered portion 308b of an actuator 308. The distributed mode loudspeaker 300 may be used in the device 100, e.g., as the distributed mode loudspeaker 102. The distributed mode loudspeaker 300 includes a panel 302, e.g., such as the panel 104.

A base bracket 304, included in the distributed mode loudspeaker 300, connects a support molding 310 and the actuator 308 to the panel 302. For instance, the base bracket 304 may be rigidly connected to the support molding 310 during manufacturing of the distributed mode loudspeaker 300. The base bracket 304 may be rigidly connected to the panel 302 during manufacturing of the distributed mode loudspeaker 300. The connections between the base bracket 304 and both the panel 302 and the support molding 310 are sufficient to allow the base bracket 304 to transfer a force, generated by the actuator 308, from the support molding 310 to the panel 302 to cause the panel 302 to generate sound.

As shown in FIGS. 3A-B, the support molding 310 may surround the actuator 308 to hold the actuator 308 in place. The support molding 310 may be rigidly connected to the actuator 308 to transfer the force, generated by the actuator 308, from the actuator 308 to the base bracket 304 and the panel 302.

In some implementations, the distributed mode loudspeaker 300 includes one or more other components between the base bracket 304 and the panel 302. For instance, the distributed mode loudspeaker 300 may include a chassis that rigidly connects the base bracket 304 and the panel 302.

In some implementations, a system that includes the distributed mode loudspeaker 300 includes one or more other components between the base bracket 304 and the panel 302. For example, the system may include a chassis that rigidly connects the base bracket 304 and the panel 302, the latter two of which are included in the distributed mode loudspeaker 300.

The distributed mode loudspeaker 300 includes a support element 306. The support element 306 may include one or more layers that enable the support element 306 to change shape, e.g., spatial volume, in response to receipt of a signal. For instance, the support element 306 may include an electroactive element 306a and an adjustment support 306b, e.g., as one or more layers included in the support element 306.

The combination of the electroactive element 306a and the adjustment support 306b may cause the support element 306 to be a variable compliance support assembly. For example, when a frequency selection module included in the distributed mode loudspeaker 300 applies a control voltage to the electroactive element 306a, the electroactive element 306a may have a z-dimension displacement that compresses the adjustment support 306b, e.g., commensurately with the applied voltage. Compression of the adjustment support 306b causes the adjustment support 306b to change shape, e.g., causes a width, a length, or both, of the adjustment support 306b to increase. The change in shape of the adjustment support 306b increases a first length of a supported portion 308a of the actuator 308 and decrease a second length of the cantilevered portion 308b of the actuator 308. The change in the second length of the cantilevered portion 308b of the actuator 308 causes a change in the fundamental frequency $F_0$ of the actuator 308. For example, a change in compliance, e.g., a property such as spatial volume or shape or both, of the support element 306 may change the effective length of the adjustment support 306b and allow the fundamental frequency $F_0$ of the actuator 308 to be adjusted within the operating limits of the distributed mode loudspeaker 300.

Use of the support element 306, with the electroactive element 306a and the adjustment support 306b, by the distributed mode loudspeaker 300 may allow the distributed mode loudspeaker to automatically adjust its fundamental frequency $F_0$ based on the output mode of the distributed mode loudspeaker 300, e.g., an optimal output frequency range. Because different output modes may have different output frequency ranges, the distributed mode loudspeaker 300 may use the optimal frequency range for a particular output mode to adjust the fundamental frequency $F_0$ of the actuator 308 for that optimal frequency range. For instance, a hands-free output mode may have a lower optimal frequency range than a receiver output mode. The distributed mode loudspeaker 300 may select a lower fundamental frequency $F_0$ for a hands-free output mode compared to a higher fundamental frequency $F_0$ for a receiver output mode.

A device, e.g., the distributed mode loudspeaker 300 or a device that includes the distributed mode loudspeaker 300, can monitor the frequency response of a sound generated by the distributed mode loudspeaker 300 in the near-field to determine a mechanical coupling of the device, e.g., if the device is being used as in receiver mode or in hands-free mode. The distributed mode loudspeaker 300 can use the frequency response to adjust the fundamental frequency $F_0$ to optimize performance of the distributed mode loudspeaker 300 depending upon the mechanical coupling of the device. For instance, the device may determine if the device is likely handheld and in receiver mode or the device is likely contacting a surface and in hands-free mode. The device may use a result of this determination to determine whether to change a fundamental frequency $F_0$ of the actuator 308.

In some implementations, the device or the distributed mode loudspeaker 300 can determine the current output mode of the device by monitoring one or more applications running on the device, e.g., a phone application, a music application, a video application, etc. The applications running on the device may indicate the content included in an output sound for the distributed mode loudspeaker 300 to generate. The device, e.g., the distributed mode loudspeaker 300, may use data for the one or more applications to determine the current output mode, a fundamental frequency $F_0$ for the actuator 308, or both. The data for the one or more applications may indicate which applications are executing on the device, which applications are generating sound, which applications recently received user input, or a combination of two or more of these. For instance, the distributed mode loudspeaker 300 may increase the length of the cantilevered portion 308b when generating sound for a music application or a video application that should be presented in hands-free mode. The distributed mode loudspeaker 300 may decrease the length of the cantilevered portion 308b when generating sound for a phone application that should be presented in receiver mode.

In some examples, the distributed mode loudspeaker 300 may determine an output fundamental frequency $F_0$ for the actuator 308 using one or more properties for a user of a device that includes the distributed mode loudspeaker 300, e.g., in addition to or instead of using data for one or more applications executing on the device. For example, when a device is typically in a receiver mode for a phone conversation, the distributed mode loudspeaker 300 may use a longer length cantilevered portion 308b of the actuator 308 compared to a length that would be used for a hands-free mode. When a device is typically in a hands-free mode for a phone conversation, the distributed mode loudspeaker 300 may use a shorter length cantilevered portion 308b of the actuator 308 compared to a length that would be used for a receiver mode. The one or more properties for the user may be determined based on user input, analysis of user interaction with the device, e.g., historical data, or both.

In some implementations, the distributed mode loudspeaker 300 may adjust the fundamental frequency $F_0$ of the actuator 308 based on a volume of sound for the distributed mode loudspeaker 300 to generate. For instance, the distributed mode loudspeaker 300 may select a higher fundamental frequency $F_0$ for generation of higher volume sounds. The distributed mode loudspeaker may select a lower fundamental frequency $F_0$ for generation of lower volume sounds.

In some implementations, the distributed mode loudspeaker 300 may determine whether, with a current fundamental frequency $F_0$ of the actuator, a sound generated by the distributed mode loudspeaker 300 will satisfy a threshold volume. When the sound generated by the distributed mode loudspeaker 300 will satisfy a threshold volume, e.g., is greater than or equal to the threshold volume, based on the current fundamental frequency $F_0$, the distributed mode loudspeaker 300 may determine not to change the length of the cantilevered portion 308b or determine to decrease the length of the cantilevered portion 308b and increase the fundamental frequency $F_0$ of the actuator 308. When the sound generated by the distributed mode loudspeaker will not satisfy the threshold volume, e.g., is less than or equal to the threshold volume, based on the current fundamental frequency $F_0$, the distributed mode loudspeaker 300 may determine to increase the length of the cantilevered portion 308b and decrease the fundamental frequency $F_0$ of the actuator 308.

The electroactive element 306a is made from an element that physically reacts based on an input signal. The input signal may be heat, charge, or both. The electroactive element 306a may have a low latency reaction time. The electroactive element 306a may be a polymer. In some examples, the electroactive element 306a may be a piezoelectric material. For instance, the electroactive element 306a may be a ceramic or crystalline piezoelectric material. Examples of ceramic piezoelectric materials include barium titanate, lead zirconium titanate, bismuth ferrite, and sodium niobate, for example. Examples of crystalline piezoelectric materials include topaz, lead titanate, lithium niobate, and lithium tantalite.

The adjustment support 306b may be made from an element that changes spatial volume shape in response to pressure. For instance, the adjustment support 306b may be made from a material with consistent, constant, or both, properties throughout the adjustment support 306b to allow the adjustment support 306b to change shape consistently upon receipt of pressure by the electroactive element 306a. The adjustment support 306b may be an elastomer, e.g., neoprene or a silicon compound.

Figure 4:
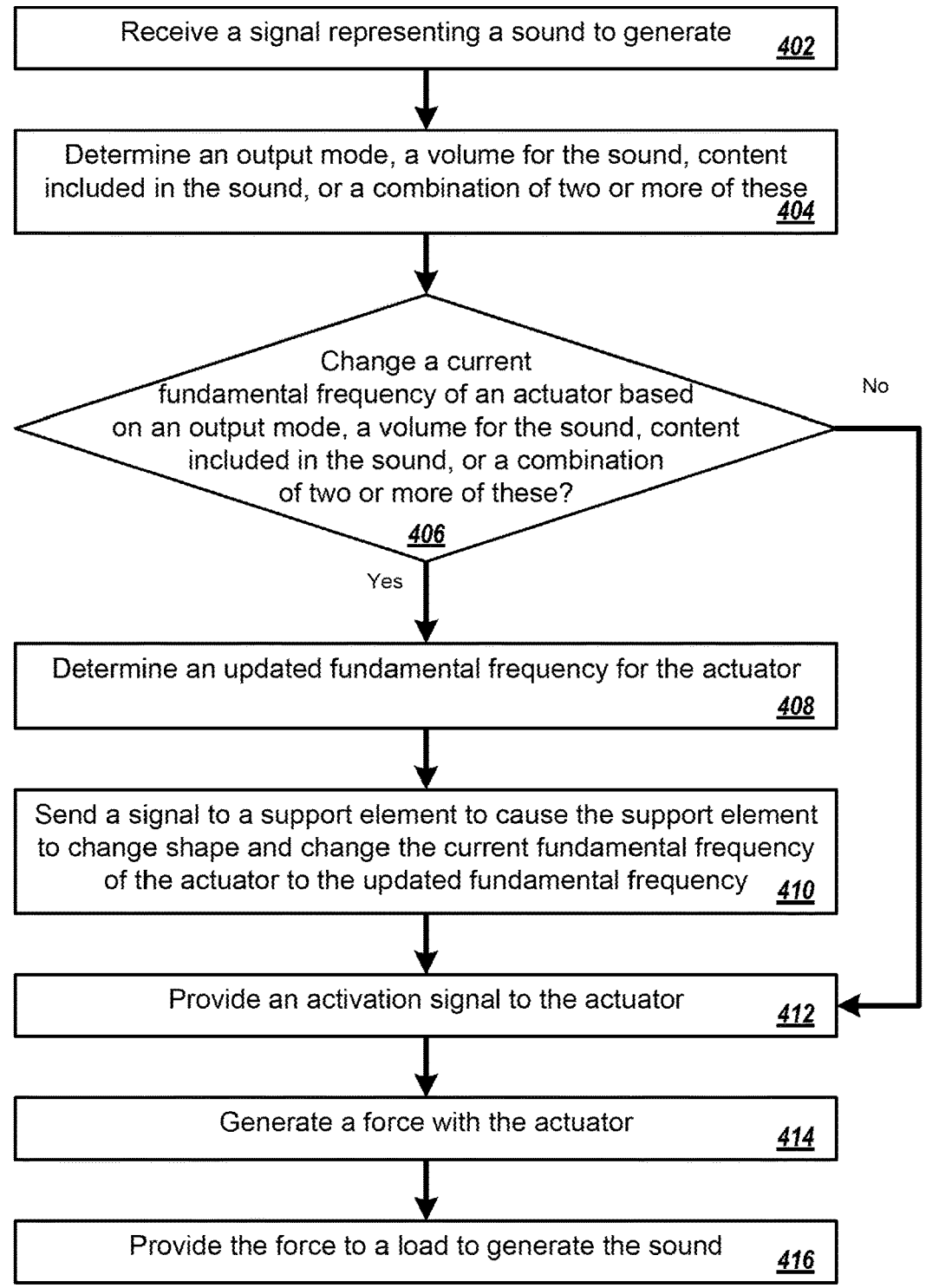
FIG. 4 is a flow diagram of a process for changing a fundamental frequency of an actuator.

FIG. 4 is a flow diagram of a process 400 for changing a fundamental frequency of an actuator. For example, the process 400 can be used by the distributed mode loudspeaker 102 or the distributed mode loudspeaker 300.

A distributed mode loudspeaker receives a signal representing a sound to generate (402). For example, a frequency selection module, included in the distributed mode loudspeaker, may receive a signal that identifies the sound to generate. The signal may be any appropriate type of signal for a speaker, a distributed mode loudspeaker, or both. The frequency selection module may receive the input from an application executing on a device, e.g., a phone or music application on a smartphone. The device may include the distributed mode loudspeaker, e.g., a smartphone that includes the distributed mode loudspeaker. The distributed mode loudspeaker may be separate from and connected to the device, e.g., by a cable or wirelessly.

The distributed mode loudspeaker determines an output mode, a volume for the sound, content included in the sound, or a combination of two or more of these (404). For instance, the frequency selection module may determine one or more of the output mode, the volume for the sound, or the content included in the sound. In some examples, the frequency selection module may determine one or more of the output mode, the volume for the sound, or the content included in the sound by analyzing the received signal. The frequency selection module may receive data that identifies one or more of the output mode, the volume for the sound, or the content included in the sound. For instance, the frequency selection module may receive the data from the device. The data may be included in the received signal or received separately from the signal.

The distributed mode loudspeaker determines whether to change a current fundamental frequency of an actuator based on an output mode, a volume for the sound, content included in the sound, or a combination of two or more of these (406). For example, the frequency selection module determines whether the current fundamental frequency of the actuator included in the distributed mode loudspeaker is an optimal fundamental frequency to use when generating the sound. The distributed mode loudspeaker, e.g., the frequency selection module, may use one or more of the output mode, the volume for the sound, or the content included in the sound when determining whether the current fundamental frequency of the actuator is an optimal fundamental frequency to use when generating the sound.

In response to determining to change the current fundamental frequency of the actuator, the distributed mode loudspeaker determines an updated fundamental frequency for the actuator (408). The distributed mode loudspeaker, e.g., the frequency selection module, may determine the updated fundamental frequency using one or more of the output mode, the volume for the sound, or the content included in the sound. In some examples, the distributed mode loudspeaker may use a frequency or frequency range to determine the updated fundamental frequency.

The updated fundamental frequency may be an optimal fundamental frequency for the actuator to use when generating the sound. For instance, the optimal fundamental frequency may allow the distributed mode loudspeaker to generate a higher volume sound, more accurately reproduce the sound, or both, compared to other fundamental frequencies.

The distributed mode loudspeaker sends a signal to a support element to cause the support element to change shape and change the current fundamental frequency of the actuator to the updated fundamental frequency (410). For example, the frequency selection module may send the signal to the support element to cause the support element to change shape. The signal may be a particular current, heat, or both.

The distributed mode loudspeaker, e.g., the frequency selection module, may determine an amount of current, an amount of heat, or both, to provide to the support element based on the updated fundamental frequency. For instance, the amount of current may indicate the degree to which the current fundamental frequency must change so that the actuator has the updated fundamental frequency.

In some implementations, the distributed mode loudspeaker, e.g., the frequency selection module, may determine a change in current, a change in heat, or both, to provide to the support element based on the updated fundamental frequency. When the distributed mode loudspeaker is already providing a current, heat, or both, to the support element to maintain a shape, a spatial volume, or both, of the support element, and a corresponding fundamental frequency of the actuator, the distributed mode loudspeaker may determine an increase or a decrease in the current, heat, or both, provided to the support element so that the actuator will have the updated fundamental frequency.

The distributed mode loudspeaker provides an activation signal to the actuator (412). For example, the distributed mode loudspeaker may provide an activation signal to one or more electrodes included in the actuator that cause the actuator to actuate and generate a force. The signal may be a current. When the distributed mode loudspeaker sends a signal to the support element, the distributed mode loudspeaker may provide the activation signal to the actuator after changing the current fundamental frequency of the actuator to the updated fundamental frequency.

When the distributed mode loudspeaker determines not to change the current fundamental frequency of the actuator, the distributed mode loudspeaker provides the activation signal to the actuator without changing the fundamental frequency of the actuator. For instance, the distributed mode loudspeaker provides current to the actuator after receiving the signal representing the sound to generate and without sending a signal to the support element based on the signal.

The distributed mode loudspeaker may include a drive module that provides the current to the one or more electrodes included in the actuator. The drive module may be the same component as the frequency selection module. The drive module may be a different component, included in the distributed mode loudspeaker, from the frequency selection module.

The distributed mode loudspeaker generates a force with the actuator (414). For example, the actuator receives the activation signal and actuates, which causes the actuator to generate a force. Receipt of a current by electrodes included in the actuator may cause the actuator to actuate and generate the force.

The distributed mode loudspeaker provides the force to a load to generate the sound (416). For instance, a rigid connection between the actuator and a support molding may cause the actuator to provide at least some of the generated force to the support molding. A rigid connection between the support molding and a panel may cause the support molding to provide at least some of the generated force to the panel. The rigid connection between the support molding and the panel may include a base bracket that transfers at least some of the force from the support molding to the panel.

In some implementations, the process 400 can include additional steps, fewer steps, or some of the steps can be divided into multiple steps. For example, the distributed mode loudspeaker may determine whether to change a current fundamental frequency of an actuator, determine the updated fundamental frequency, and send the signal to the support element to cause the support element to change the current fundamental frequency to the updated fundamental frequency without performing the other steps of the process 400.

In some implementations, one or more of the components described in this document can be included in devices other than a distributed mode loudspeaker. For example, a haptic feedback system may use the actuator, e.g., the distributed mode actuator, the support element, the frequency selection module, or a combination of two or more of these, to generate haptic feedback. The haptic feedback system may use the actuator to generate energy in a frequency range between 250 Hz and 300 Hz. The haptic feedback system may be included in a device, e.g., the distributed mode loudspeaker described above. The haptic feedback system may use an actuator that also generates energy for use creating sound, e.g., when the haptic feedback system and a distributed mode loudspeaker use the same actuator for different types of output.

In some implementations, when the distributed mode loudspeaker is included in a smartphone, the smartphone may include a display, e.g., a display panel, one or more processors, and one or more memories. The display may be a load used by the distributed mode loudspeaker to generate sound. In some examples, the smartphone may include a load different from the display for the distributed mode loudspeaker to use when generating a sound.

The memories may store instructions for an application, e.g., from which the distributed mode loudspeaker can receive the input identifying the sound to output. The one or more processors, e.g., one or more application processors, may use the instructions stored on the one or more memories to execute the application. During execution of the application, e.g., a phone application or a music application or a game, the application may determine a sound to output to a user. The application provides, to the distributed mode loudspeaker, data for the sound.

The frequency selection module or the drive module or both, included in the distributed mode loudspeaker, receive the data for the sound as input. The frequency selection module may be the same component in the smartphone as the drive module. In some examples, the frequency selection module is a different component in the smartphone from the drive module. The frequency selection module uses the data for the sound to determine whether to change a current fundamental frequency of an actuator included in the distributed mode loudspeaker and, if necessary, provides a signal to a support element included in the distributed mode loudspeaker. The drive module provides current to one or more electrode pairs included in the distributed mode loudspeaker after any change to the current fundamental frequency for generation of the sound.

In some examples, the one or more processors, the one or more memories, or both, are separate from the drive module, the frequency selection module, or both. For example, the frequency selection module, the drive module, or both, may include at least one processor, at least one memory, or both. The at least one processor may be a different set of processors from the one or more processors. The at least one memory may be a different memory from the one or more memories.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable processor, or multiple processors. The apparatus can also be or further include special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, an operating system, or a combination of one or more of them.

For example, a distributed mode loudspeaker, e.g., a frequency selection module or a drive module or both, may include a data processing apparatus. The distributed mode loudspeaker may use the data processing apparatus, in conjunction with at least one memory, to perform one or more of the operations described in this document.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

A distributed mode loudspeaker may include one or more memories that store instructions which, when executed by the distributed mode loudspeaker, cause the distributed mode loudspeaker to perform one or more operations described in this document. For instance, the instructions may cause the distributed mode loudspeaker, e.g., a frequency selection module, to determine an output frequency subset, energize one or more electrodes, or both. In some examples, the frequency selection module or a drive module or both may include the one or more memories or some of the one or more memories.

To provide for interaction with a user, embodiments of the subject matter described in this specification can be implemented on a computer having a display device, e.g., an LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A device comprising:
   a distributed mode loudspeaker, comprising:
   a panel comprising a display; and
   an actuator adapted to cause vibration of the panel to generate sound waves during operation of the device, the actuator comprising:
   a cantilevered portion having a fundamental frequency, and adapted to create a force to cause the vibration of the panel during operation of the device;
   a stub connecting the cantilevered portion to the panel; and
   a support element connected to the stub and adapted to adjust, based on a change to a shape of the support element, the fundamental frequency of the cantilevered portion; and
   a frequency selection module that provides a signal to the support element to cause the support element to change shape.

2. The device of claim 1, wherein the frequency selection module is adapted to select an amount of current as the signal to provide to the support element.

3. The device of claim 1, wherein the frequency selection module is adapted to:
   determine an output mode for the distributed mode loudspeaker; and
   select the signal to provide to the support element using the determined output mode.

4. The device of claim 3, wherein the output mode comprises one of a receiver mode or a hands-free mode.

5. The distributed mode loudspeaker of claim 4, wherein:
   the frequency selection module is adapted to select the signal that will cause an increase in the length and the second fundamental frequency to be lower than the first fundamental frequency based on the frequency selection module determining that the output mode is the receiver mode; or
   the frequency selection module is adapted to select the signal that will cause a decrease in the length and the second fundamental frequency to be higher than the first fundamental frequency based on the frequency selection module determining that the output mode is the hands-free mode.

6. The device of claim 1, wherein the frequency selection module is adapted to:
   determine a type of audio content to generate; and
   select the signal to provide to the support element using the type of content to generate.

7. The device of claim 6, wherein the type of audio content to generate comprises one of music, a telephone conversation, video playback, audio for a game, or a device feedback sound.

8. The device of claim 1, wherein the frequency selection module is adapted to:
   determine whether an output volume for a sound the load will generate satisfies a threshold volume; and
   select the signal to provide to the support element based on the determination whether the output volume for the sound the load will generate satisfies the threshold volume.

9. The device of claim 8, wherein the frequency selection module is adapted to select the signal that will cause an increase in the length and the second fundamental frequency to be lower than the first fundamental frequency based on the output volume does not satisfy the threshold volume.

10. The device of claim 8, wherein the frequency selection module is adapted to select the signal that will cause a decrease in the length, and the second fundamental frequency to be higher than the first fundamental frequency based on the output volume satisfying a threshold volume.

11. The device of claim 1, wherein:
    the distributed mode loudspeaker comprises a base adjacent to a first surface of the support element opposite a second surface of the support element that is adjacent to the supported portion of the actuator;
    the support element comprises an electroactive element that includes the first surface and an adjustment support that includes the second surface, a third surface of the electroactive element that is opposite the first surface connecting to a fourth surface of the adjustment support that opposite that the second surface; and
    the frequency selection module is adapted to provide the signal to the electroactive element to cause the electroactive element to apply a force onto the adjustment support, changing the shape of the adjustment support, adjusting the size of the length and changing the first fundamental frequency to the second fundamental frequency with which the load will generate sound waves.

12. The device of claim 11, wherein the electroactive element comprises a material with a low latency reaction.

13. The device of claim 11, wherein the adjustment support comprises an elastomer.

14. The device of claim 1, wherein the actuator comprises piezoelectric material.

15. The distributed mode loudspeaker of claim 1, wherein the length of the cantilevered portion and a second length of the supported portion are along the same axis of the distributed mode loudspeaker.

16. The distributed mode loudspeaker of claim 15, wherein a total length of the actuator is substantially fixed, the total length comprising a sum of the first length and the second length.

17. The distributed mode loudspeaker of claim 1, wherein the frequency selection module comprises a digital signal processor.

18. A method comprising:
- receiving, by a device comprising distributed mode loudspeaker, a signal representing a sound to generate;
- determining, by a frequency selection module in the device, to change a current fundamental frequency of an actuator included in the distributed mode loudspeaker that includes a supported portion and a cantilevered portion having a length, a first fundamental frequency, and adapted to create a force to cause vibration of a load to generate sound waves using the first fundamental frequency;
- based on determining to change the current fundamental frequency of the actuator, sending, by the frequency selection module, a signal to a support element connected to the supported portion of the actuator to cause the support element to change shape and adjust, based on the changed shape of the support element, a size of the length of the cantilevered portion to change the first fundamental frequency to a second fundamental frequency with which the load will generate sound waves; and
- after sending the signal to the support element, providing, by the distributed mode loudspeaker, an activation signal to the actuator to cause the actuator to generate a force that vibrates the load which generates the sound.

* * * * *